United States Patent [19]

Winnerl et al.

[11] Patent Number: 5,798,297
[45] Date of Patent: Aug. 25, 1998

[54] METHOD FOR PRODUCING A SEMICONDUCTOR COMPONENT WITH ELECTRICAL CONNECTION TERMINALS FOR HIGH INTEGRATION DENSITY

[75] Inventors: Josef Winnerl; Johann Alsmeier, both of Munich, Germany

[73] Assignee: Siemens Aktiengesellschaft, Munich, Germany

[21] Appl. No.: 545,648

[22] PCT Filed: May 2, 1994

[86] PCT No.: PCT/DE94/00485

§ 371 Date: Jan. 2, 1996

§ 102(e) Date: Jan. 2, 1996

[87] PCT Pub. No.: WO94/25986

PCT Pub. Date: Nov. 10, 1994

[30] Foreign Application Priority Data

May 5, 1993 [DE] Germany ............... 43 14 906.5

[51] Int. Cl.⁶ ............................................. H01L 21/4763
[52] U.S. Cl. .................... 438/622; 438/639; 438/598; 438/455
[58] Field of Search ......................... 438/118, 639, 438/675, 622, 455, 598, 637; 257/774, 758

[56] References Cited

U.S. PATENT DOCUMENTS

| | | |
|---|---|---|
| 4,847,732 | 7/1989 | Stopper et al. |
| 5,023,205 | 6/1991 | Reche ............... 148/DIG. 20 |
| 5,422,303 | 6/1995 | Klose et al. ............... 438/359 |

FOREIGN PATENT DOCUMENTS 0 371 861  6/1990  European Pat. Off.

OTHER PUBLICATIONS

Patent Abstracts of Japan: vol. 17, No. 9, 18 Jan. 1993, JP 04 240 763 dated 28 Aug. 1992.

"Future Packaging Depends Heavily on Materials", by David Maliniak, Electronic Design, Jan. 9, 1992, pp. 83–97.

Primary Examiner—Tuan H. Nguyen
Attorney, Agent, or Firm—Hill & Simpson

[57] ABSTRACT

A semiconductor component, wherein the common power supply is fed via buried metal layers (7, 9) which are present over the entire area and are connected to active functional elements (1) by vertical conductive connections (13, 15), the planes with which contact is not intended to be made being insulated from these vertical connections (13, 15) by dielectric (11) sheathing the latter.

5 Claims, 2 Drawing Sheets

METHOD FOR PRODUCING A SEMICONDUCTOR COMPONENT WITH ELECTRICAL CONNECTION TERMINALS FOR HIGH INTEGRATION DENSITY

SUMMARY OF THE INVENTION

The present invention relates to semiconductor components having a special structure for electrical connection which allows a high integration density of functional elements on a chip.

For complex CMOS circuits, a positive supply voltage and a negative supply voltage (VDD and VSS) must be fed in, and a multiplicity of signal lines must be routed between the individual transistors. For this purpose, a plurality of wiring planes, i.e. layer-type portions having interconnections and metallizations, must be used, which contain, for example, aluminum interconnections which are insulated from one another by a dielectric such as, for example, SiO2. Connections between these individual planes of interconnections and contacts or from the bottom plane to the transistors and other functional elements on the chip are produced by metal contacts. These contacts are essentially metal-filled holes in the dielectric. With increasing circuit complexity, an ever-increasing number of independent planes with interconnections is necessary in order to provide the requisite electrical connections in sufficient density. As the number of planes increases, the requirement for planarity of the respective dielectric intermediate layers increases, since if the individual layers are insufficiently planarized, production of the next interconnection plane gives rise to technological difficulties. The minimum achievable dimensions of the individual structures consequently increase drastically toward the upper planes. The so-called packing density that can be achieved is thereby considerably reduced. Small capacitances between the signal lines are furthermore necessary for high operating speeds. Supply lines to the external electrical connection terminal should have the lowest possible input line resistances and a high current-carrying capacity. In this case, high capacitances are more beneficial, since these capacitances act as charge stores and can block current spikes.

BACKGROUND OF THE INVENTION

The object of the present invention is to specify a design for a semiconductor component, in which the complexity of the electrical connections is reduced for large-scale integration of the functional elements.

In general terms the present invention is a method for producing a semiconductor component having at least one buried full-area metal layer which is provided with a connection terminal for external power supply, and having active functional elements in a silicon layer. In a first step, a layer structure consisting of each buried full-area metal area and this silicon layer for these active functional elements is produced on a substrate. Dielectric layers for electrical insulation are in each case applied between these layers. In a second step, these active functional elements are produced. In a third step, openings which in each case extend such that a region, intended for making contact, of a functional element is exposed in each opening. In a fourth step, a dielectric is applied onto the wall of these openings up to a height provided for electrical insulation. This region provided for making contact remains exposed in each case. In a fifth step, these openings are filled with metal in order to produce vertical electrically conductive connections between the respective metal layer and this region, provided for making contact, of the functional element.

Advantageous developments of the present invention are as follows.

The fourth step is carried out by depositing the dielectric into the openings, etching away the dielectric anisotropically outside and on the bottom of the openings, filling the openings with a material that resists the etching, in each case up to the height up to which the dielectric is intended to remain, removing the portion of dielectric thereby remaining exposed and removing the material that resists this etching.

In the first step, each buried full-area metal layer is produced from a silicide of a metal from the group titanium, tungsten and tantalum.

The first step is carried out by, in a first additional step, applying at least one full-area metal layer onto a first substrate and covering it with a full-area dielectric layer and applying a dielectric layer over the whole area onto a second silicon substrate. In a second additional step, these dielectric layers are brought to face each other and are connected together by wafer bonding.

The semiconductor component is produced in the framework of a CMOS process. In the first step, two such metal layers are produced, which are each provided with a connection terminal for the positive pole or the negative pole, respectively, of a supply voltage.

The semiconductor component according to the invention reduces the complexity of the electrical connections by virtue of the fact that full-area metal layers are present for input of the external supply voltage. These metal layers are buried in the substrate or between the substrate and the active semiconductor layers and are insulated from one another by dielectric intermediate layers. The semiconductor component according to the invention can be produced particularly advantageously with CMOS circuits using SOI (silicon on insulator) technology. The signal lines are in this case arranged conventionally over the functional elements, i.e. on the side remote from the substrate. The signal lines are produced in the form of conventional interconnections and metal contacts. It is possible for only one full-area buried metal layer, for example as the ground connection contact, or at least two metal layers, each for one of the supply voltages VDD and VSS, to be present. Connection of the functional elements (transistors and the like) to these metal layers is produced by vertical conductive connections through the dielectric intermediate layers. These connections are, for example, thin vertically arranged metal pins or metal cylinders which are laterally enclosed all round by the dielectric of the intermediate layers. Instead of this, it is also possible for larger apertures to be etched in the layer planes and for the vertical connections to be produced by interconnections which do not completely fill these openings. However, in view of the desired planar design of the semiconductor component, a buried form of contact between metal layers and interconnections, which are respectively arranged in one plane of the layer structure, is expedient. When a plurality of full-area metal planes for the supply voltage are present, the connection terminals of the active functional elements in the layer structure are connected to the full-area metal planes arranged further away using vertically arranged conductors which are routed through apertures in the full-area metal planes arranged in between and are insulated from the latter by dielectric sheathing.

This semiconductor component design according to the invention has the advantage that a complete metal layer is in each case used for feeding in each pole of a supply voltage. Microstructuring is therefore not required for this input line. The production outlay is thereby reduced and leads to a higher expected yield of operational components. Unstructured conductor planes need not be planarized with dielectric layers. The unstructured metal planes promote the dissipation of heat losses during operation of the active functional elements. The capacitance between a plurality of full-area metal layers acts as a buffer for current spikes occurring in the supply current. Thus, a dimension of 50 nm for the insulation oxide between the metal layers results in a capacitance of approximately 70 nF per cm2 of chip surface area. The input line resistance can be minimized since the metal layers provided for the supply voltage are unstructured and their thickness is not limited by microstructuring or subsequent planarization. There may be as many such full-area buried metal layers as desired for connection of supply voltages. For the positive connection terminal and the negative connection terminal, two metal layers, which are separated from each other by an insulating intermediate layer, are expediently arranged parallel one above the other.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENTS

Figure 1:
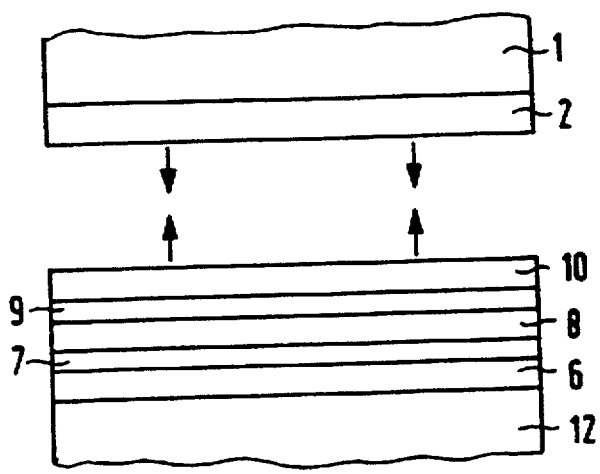
FIG. 1 depicts a first step of the present invention in which a layered structure is formed.
Figure 2:
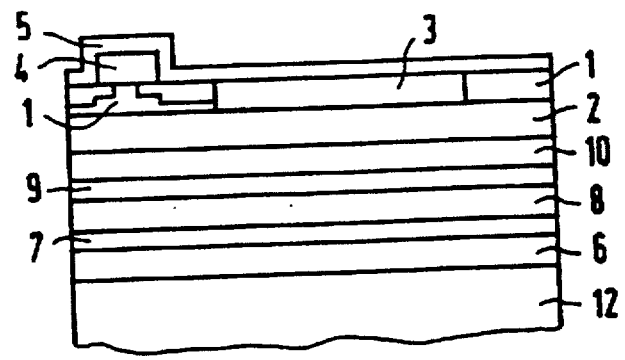
FIG. 2 depicts a second step of the present invention in which active components are produced.

As shown in FIG. 1, a first dielectric layer 6, a metal layer 7, a second dielectric layer as the intermediate layer 8, a further metal layer 9 and a third dielectric layer 10 are applied one above the other over the whole area onto a substrate 12 (for example of silicon). A dielectric layer 2 (for example oxide) is applied over the whole area onto a further substrate 1 (for example likewise silicon). The two coated substrates 1, 12 are connected together by wafer bonding via the top layers, i.e. the oxide layer 2 on the substrate 1 and the third dielectric layer 10 on the substrate 12. The three dielectric layers 6, 8, 10 on the first substrate 12 can likewise be, for example, oxide. The metal layers 7, 9 are, for example, high-melting metals such as titanium, tungsten, tantalum or silicides of these metals, or copper, gold or an aluminum alloy. The oxide layers 2, 10, which are connected together by wafer bonding, form the insulator layer of the SOI substrate produced in this way. The top substrate wafer in FIG. 1 is then thinned, for example by means of chemical mechanical polishing, to a thickness of at most 100 nm, if the intention is to produce exclusively depletion-mode MOSFETs. For other active components such as, for example, bipolar transistors, the residual thickness of this silicon layer remaining should be matched accordingly. As represented in FIG. 2, active components, in this example exclusively depletion-mode CMOS transistors, are then produced in the thinned silicon layer 1.

These transistors are produced in the silicon layer 1. Insulation regions 3 are produced between the active regions. This is done, for example, by structuring the silicon layer 1 and filling the insulation regions with oxide, or by local oxidation of these portions of the silicon layer. The active regions are doped by ion implantation to set the threshold voltage for the transistors. The dielectric (for example thermal oxide RTP) of the gate is produced and the gate material (for example doped polysilicon or metal or metal silicide) is deposited and structured. The gate contact 4 is marked on FIG. 2. The diffusion regions for the source and the drain are doped by means of ion implantation and subsequent activation (annealing). A dielectric layer 5 is deposited as a passivation layer over the whole area.

Figure 3:
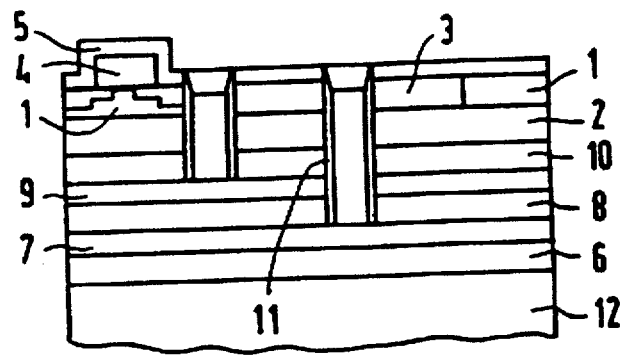
FIG. 3 depicts the etching of opening or apertures according to the present invention.

The vertical conductive connections to the metal layers 7, 9 are subsequently produced. Using a mask (photolithography), the material is etched in a cylindrical opening as far as the upper metal layer 9. The material of the dielectric layers is etched and, if appropriate, material of the silicon layer 1 is etched selectively with respect thereto. A contact hole for the lower metal layer 7 is correspondingly etched through the upper metal layer 9. In order to insulate electrically from other conductor planes the vertical conductive connections to be produced, dielectric 11 (for example oxide, PECVD) is deposited into the etched apertures. This dielectric 11 is anisotropically etched away outside and on the bottom of the etched aperture (see FIG. 3). The dielectric 11 is removed in the upper part so that the connection terminal, with which contact is to be made, of the transistor is exposed. For this purpose, the aperture is filled, with a material, for example resist, that resists the etching, up to a height to which the dielectric is intended to remain, and the exposed portion of the dielectric is then etched away anisotropically in the upper region. The regions with which contact is to be made are then exposed. The aperture can then be filled with metal 13 (see FIG. 4) by depositing, for example, tungsten over the whole area using CVD and etching it back on the upper side. The dielectric 11 insulates this metal, which forms the vertical conductive connection 13, from the planes with which contact is not to be made.

Figure 4:
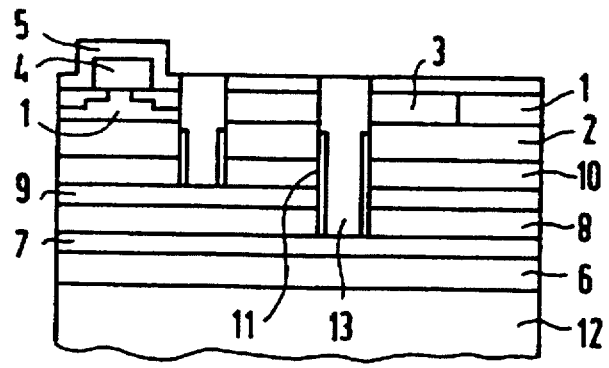
FIG. 4 depicts the step of filling the aperture with metal according to the present invention.
Figure 5:
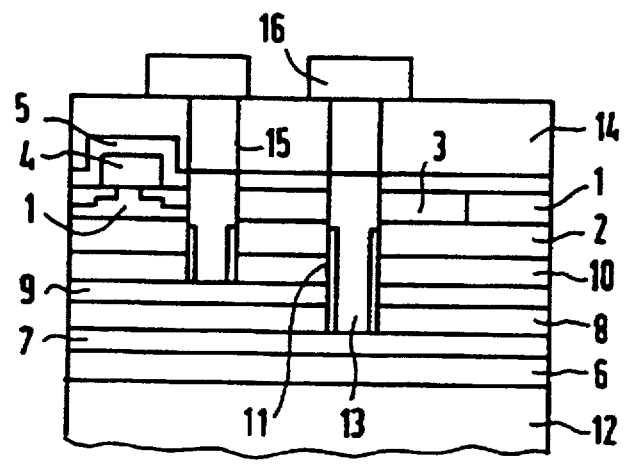
FIG. 5 depicts deposition of a dielectric layer over the entire area.

A dielectric layer 14 is then deposited over the whole area and planarized (for example oxide deposited using CVD) (see FIG. 5). Using photolithography, apertures are produced in this dielectric layer 14 above the metallic connections 13 produced. These apertures are, as described above, filled with the metal of the vertical connections. By again using photolithography, it is then possible to produce on the planarized surface of the dielectric layer 14 metal contacts 16 on the upper ends of the vertical conductive connections 13, 15 extended as described. These contacts are structured in the conventional manner. The above-described procedural steps can be repeated correspondingly to make contact with additional metal planes or for connection of the metal layers 7, 9 to conductive-track planes arranged above. In intermediate steps, respectively planarizing dielectric layers are then applied as intermediate layers for the metallization planes. The arrangement can then, if appropriate, be passivated using a cover layer. FIG. 5 shows the finished structure in cross section. The connection terminals for the external power supply are produced by corresponding etching of the layers burying the metal layers 7, 9. It is sufficient, for example, to etch away completely the layers present on a respective metal layer in a lateral region of the component that is not provided with functional elements, in order to expose the relevant metal layer. The bottom metal layer 7 can, for example, be exposed through the substrate 12. The buried full-area metal layers can also be produced by growing a layer structure on a substrate. The described production using wafer bonding is particularly simple and advantageous in view of the known technologies. The structure of the vertical conductive connections can, according to requirements, be matched to the specific component. Production is simplified by virtue of the fact that the vertical conductors can be produced, in the procedural steps for producing the horizontal interconnections, starting from the upper side of the component. The number of metal planes in the exemplary embodiment in FIG. 4 is not restricted to two; it is possible, for example, for there to be only a single full-area buried metal layer present, or a plurality thereof, which are in each case insulated from one another by dielectric intermediate layers. When making contact with metal layers respectively located at greater depths, the vertical connection should in each case be insulated from the metal planes arranged above by a dielectric sheathing.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted.

What is claimed is:

1. A method for producing a semiconductor component having at least one buried full-area metal layer which is provided with a connection terminal for an external power supply, and having active functional elements in a silicon layer, comprising the steps of:

in a first step, producing a layer structure having at least one buried full-area metal layer and having said silicon layer for the active functional elements, on a substrate; and applying dielectric layers for electrical insulation between said layers;

in a second step producing said, active functional elements;

in a third step, etching openings which extend as far as one of said metal layers such that a region, intended for making contact, of a functional element is exposed in each opening;

in a fourth step, applying a dielectric onto a wall of said openings up to a height provided for electrical insulation, said region for making contact remaining exposed in each opening;

in a fifth step, said openings are filled with metal to produce vertical electrically conductive connections between the respective metal layer and said region, provided for making contact, of the functional element.

2. The method as claimed in claim 1, wherein the fourth step is carried out by depositing the dielectric into the openings, etching away the dielectric anisotropically outside of and on the bottom of the openings, filling the openings with a material that resists the etching, in each opening up to a height to which the dielectric is intended to remain, removing a portion of the dielectric remaining exposed and removing material that resists this etching.

3. The method as claimed in claim 1, wherein, in the first step, each buried full-area metal layer is produced from a silicide of a metal from the group titanium, tungsten and tantalum.

4. The method for producing a semiconductor component as claimed in claim 1, wherein the first step is carried out by, in a first additional step, applying at least one full-area metal layer onto a first substrate and covering it with a full-area dielectric layer and applying a further dielectric layer over the whole area onto a second silicon substrate and, in a second additional step, bringing said full-area dielectric layer and said further dielectric layer to face each other and connecting them together by wafer bonding.

5. The method as claimed in claim 1 wherein the semiconductor component is produced in the framework of a CMOS process, and wherein, in the first step, two such metal layers are produced, which are each provided with a connection terminal for a positive pole or a negative pole of a supply voltage.

* * * * *